(12) United States Patent
Miyazawa

(10) Patent No.: US 6,456,125 B1
(45) Date of Patent: Sep. 24, 2002

(54) DISTRIBUTED HIGH FREQUENCY CIRCUIT EQUIPPED WITH BIAS BYPASS LINE TO REDUCE CHIP AREA

(75) Inventor: Shigemi Miyazawa, Nakakoma-gun (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/956,926

(22) Filed: Sep. 21, 2001

(30) Foreign Application Priority Data

Sep. 29, 2000 (JP) .......................... 2000-299997

(51) Int. Cl.[7] ................................. H03B 3/00
(52) U.S. Cl. ................... 327/113; 327/427; 333/104
(58) Field of Search ................. 327/427, 113, 327/355, 356, 357, 564, 565; 333/104, 101, 109, 115

(56) References Cited

U.S. PATENT DOCUMENTS 4,959,873 A * 9/1990 Flynn et al. ................. 327/408
5,289,139 A * 2/1994 Fiedziuszko et al. ........ 331/100
RE35,869 E * 8/1998 Mohwinkel .................. 333/33
6,252,474 B1 * 6/2001 Mizutani ..................... 333/139

FOREIGN PATENT DOCUMENTS

JP 11-112250 4/1999

* cited by examiner

Primary Examiner—Toan Tran
(74) Attorney, Agent, or Firm—Armstrong, Westerman & Hattori, LLP.

(57) ABSTRACT

In an amplifier circuit 20A, outputs of two transistors 23A and 23B are connected in parallel through a power superimposition circuit 27, one ends of drain bias transmission lines 29A and 29B each having a length of $\lambda/4$, where $\lambda$ denotes a signal wavelength, are connected to the outputs of the transistors 23A and 23B, respectively, the ends of the drain bias transmission lines 29A and 29B are connected not only to the capacitors 30A and 30B for signal grounding but also to one ends of bias supply lines 32A ad 32B, respectively, a jumper 34 is connected between the other ends of the bias supply lines 32A and 32B, and the one end of the bias supply line 32B is connected to a drain bias input terminal DB. The drain bias transmission lines 29A and 29B and the power superimposition circuit 27 are each disposed in the shape folded in one direction, and the bias supply lines 32A and 32B each extend in a straight line along a direction perpendicular to the folded direction.

11 Claims, 12 Drawing Sheets

US 6,456,125 B1

DISTRIBUTED HIGH FREQUENCY CIRCUIT EQUIPPED WITH BIAS BYPASS LINE TO REDUCE CHIP AREA

BACKGROUND OF THE INVENTION

1. Field of the Invention

The present invention relates generally to improvement on bias supply by being equipped with a bias bypass line independent from a signal line in a distributed high frequency circuit in which outputs of a plurality of transistors are connected in parallel to each other, more particularly, to a distributed high frequency circuit amplifying a microwave or millimeter wave signal, or mixing a local oscillation wave into an RF (Radio Frequency) or IF (Intermediate Frequency) signal.

2. Description of the Related Art

FIG. 7 shows a transmitter 10 of a base station for a portable telephone.

An IF signal and an local oscillation (Local Oscillator) signal are provided to a mixer 11 to generate an RF (Radio Frequency) signal, which is amplified to a large signal by a low noise amplifier 12 and a high-power amplifiers 13 and 14 connection in cascade, and in turn provided to an antenna not shown. Since amplifiers of such a transmitter 10 are required to have large current driving ability, the amplifier has amplifying transistors connected in parallel.

FIG. 8 shows such a prior art distributed high frequency amplifier 20W.

A high frequency signal provided to an input IN is equally distributed through a capacitor 21 and a power splitter circuit 22 to the gates of transistors 23A and 23B connected in parallel. The power splitter 22 also plays a role as an impedance matching circuit. In order to supply biases to the gates of the transistors 23A and 23B such that a high frequency signal does not leak to a gate bias input G, a resistor 24 is connected between the gate bias input G and the gate of the transistor 23A. A resistor 25 for bias adjustment is connected between the gate bias input G and ground. A bias is provided to the gate of the transistor 23B through the resistor 24 and a line of the power splitter circuit 22. The resistance value of the resistor 24 is determined such that a large variation of the bias does not arise by leaking through the resistor 24 when a signal with a large amplitude is propagating for the gates of the transistors 23A and 23B. A resistor 26 connected between the gates of the transistors 23A and 23B works to stabilize signals provided to the gates of the transistors 23A and 23B in a case where these signals are unbalanced, and each has the resistance value of several ohms. The capacitor 21 is employed to block the gate bias to leak out on the input IN side.

The drains of the transistors 23A and 23B are connected through a power superimposition circuit 27W and a capacitor 28 to an output OUT. The power superimposition circuit 27W also plays a role as an impedance matching circuit. In order to apply a bias voltage to the drains of the transistors 23A and 23B, a drain bias transmission line 29WB is connected between a drain bias input terminal DB and the output of the power superimposition circuit 27W and a capacitor 30B is connected to an end of the drain bias transmission line 29WB. The length of the drain bias transmission line 29WB is λ/4, where λ denotes a signal wavelength. The capacitor 30B is used for signal grounding. With the drain bias transmission line 29WB and the capacitor 30B, the impedance of the drain bias transmission line 29WB side measured at a node N0 between the power superimposition circuit 27W and a capacitor 28 is infinite in an ideal case, thereby blocking a signal to flow to the drain bias transmission line 29WB side from the node N0. The capacitor 28 is used to block a drain bias to leak out to the output OUT.

In order to increase the output power of the distributed high frequency amplifier 20W, it is required to increase the drain currents of the transistors 23A and 23B. When the distributed high frequency amplifier 20W is formed in an MMIC (Monolithic Microwave Integrated Circuit), a metal film of a line is thin and sheet resistance thereof is comparatively large, so the line width is required to be wide such that a voltage drop caused by a resistance component is reduced. The line width of the drain bias transmission line 29WB is required to be wide since the drain current for the two transistors 23A and 23B flows therethrough. Further, since the drain current flows through the power superimposition circuit 27W, the width of a current path thereof also has to be wider.

However, since the power superimposition circuit 27W is necessary to work as the matching circuit as well, the line width thereof is limited. Further, the impedance of the drain bias transmission line 29WB side measured at the node N0 is actually finite and a high frequency signal leaking out to the drain bias transmission line 29WB side from the node N0 is proportional to the ratio of the impedance of the configuration from which the drain bias transmission line 29WB is removed measured at the node N0 to the impedance of the drain bias transmission line 29WB side from the node N0. Hence, the position of the node N0 is preferably closer to the drain electrodes of the transistors 23A and 23B each with a relatively small impedance. In other words, since the node N0 is disposed apart from the drain electrodes of the transistors 23A and 23B, a signal is leaked out to the drain bias transmission line 29WB side from the node N0.

FIG. 9 shows a configuration to be able to solve such problems, wherein one ends of drain bias transmission lines 29A and 29B are connected to the drain electrodes of the respective transistors 23A and 23B so as to be close thereto. The other end of the drain bias transmission line 29A is connected to a drain bias input DA, on one hand, and grounded through a capacitor 30A, on the other hand. Likewise, the other end of the drain bias transmission line 29B is connected to the drain bias input terminal DB, on one hand, and grounded through the capacitor 30B, on the other hand.

In such a configuration, since no drain bias current flows through the power superimposition circuit 27, the line width of the power superimposition circuit 27 can be designed freely such that the power superimposition circuit 27 functions sufficiently as a matching circuit. Further, each width of the drain bias transmission lines 29A and 29B can be half that of the drain bias transmission line 29WB of FIG. 8 since the value of drain current flowing through each of the drain bias transmission lines 29A and 29B is half that of the drain bias transmission line 29WB of FIG. 8. Furthermore, signals leaked out into the drain bias transmission lines 29A and 29B from nodes NA and NB can be reduced.

However, since the two drain bias inputs DA and DB are required to be provided on both sides of the circuit, wiring of the drain bias transmission lines between a plurality of distributed amplifiers are complex in a case where the plurality of distributed amplifiers are cascaded as shown in FIG. 7.

FIG. 10 shows a configuration to be able to solve such a problem, wherein the drain bias is only provided from the drain bias input terminal DB. However, the drain current to the transistor 23A flows through the power superimposition circuit 27W; therefore the line width of the power superimposition circuit 27W is necessary to be wider, which disables the line width to be freely designed such that the power superimposition circuit 27W works sufficiently as the matching circuit. Further, it is necessary to flow a drain current into the drain bias transmission line 29WB for the two transistors 23A and 23B, and it is necessary to make the drain load of the transistor 23A be equal to that of the transistor 23B; therefore the line width of the drain bias transmission lines 29WA and 29WB have to be double that of the drain bias transmission lines 29A and 29B of FIG. 9, leading to increase in chip area.

FIG. 11 shows a layout in a case where the circuit of FIG. 10 is formed in an MMIC.

All the parts of FIG. 11 are enclosed in an IC package. An outer frame FR is of an insulator on which the gate bias input G and the drain bias input terminals DB, which are inner leads, are arranged. Inside the outer frame FR, there are disposed an MMIC chip and microchip condensers 31A and 31B for drain bias voltage stabilization not shown in FIG. 10.

Bonding wires are used in connection between input/output pads on the MMIC chip and electrodes outside the MMIC chip. That is, by bonding wires, one electrode (upper surface) of the microchip condenser 31A is connected to the drain bias transmission line 29WA, one electrode of the microchip condenser 31B is connected to the drain bias transmission line 29WB and the drain bias input terminal DB, and a pad connected to the resistor 24 is connected to the gate bias input G. The other electrodes (lower surface) of the microchip condensers 31A and 31B are grounded.

On the MMIC chip, each resistor is made of a TF (thin film) resistor, each capacitor is made of a MIM (metal-insulator-metal) structure, and each line is a microstrip line. The power splitter circuit 22 comprises transmission lines 221 and 222, and capacitors 223, 224 and 225. The power superimposition circuit 27 W comprises transmission lines 271W and 272W, and capacitors 273 and 274. Each of via holes H1 to H9 and HA to HC of FIG. 11 are to connect an electrode on the front surface to a ground plane on the back surface. Each of the transistors 23A and 23B is constructed of two transistors connected in parallel to each other so as to improve the circuit characteristics (an impedance conversion ratio becomes smaller, and an input signal phase difference between the gates of the transistors 23A and 23B becomes smaller) in comparison with a case where each of the transistors 23A and 23B is constructed of only one transistor.

Although the gate bias resistors 24 are connected to an input side line of the power splitter circuit 22, which is different from the resistor 24 in FIG. 10, there is no problem in either case.

Since the line widths of the drain bias transmission lines 29WA and 29WB, and transmission lines 271W and 272W of the power superimposition circuit 27 W are wide, which cause a larger chip area.

FIG. 12 shows a distributed high frequency amplifier 20Z of a configuration to solve such a problem, wherein a drain bias current does not flow into the power superimposition circuit.

In this distributed high frequency amplifier 20Z, drain bias transmission lines 29C and 29D are connected between the drain bias transmission lines 29WA and 29WB, and the node between the drain bias transmission lines 29C and 29D is grounded through a capacitor 30C for signal grounding. Each length of the drain bias transmission lines 29C and 29D is $\lambda/4$ which is equal to that of the drain bias transmission lines 29WA and 29WB. In regard to signals, the impedance values of the drain bias transmission line 29C side measured at the node NA and the drain bias transmission line 29D side measured at the node NB are both infinite in an ideal case, thereby blocking signal leakage. Since the drain current flowing through the drain bias transmission lines 29C and 29D is for the transistor 23A, the line width thereof is half that of the drain bias transmission line 29WB.

However, the total length of the drain bias transmission lines is double that of FIG. 10, and the line width of the drain bias transmission lines 29WA and 29WB are as wide as that in FIG. 10, so a chip area is larger.

SUMMARY OF THE INVENTION

Accordingly, it is an object of the present invention to provide a distributed high frequency circuit capable of decreasing a chip area together with reducing the number of direct current bias terminals without degrading circuit characteristics.

In one aspect of the present invention, there is provided a distributed high frequency circuit wherein outputs of first and second transistors are connected in parallel through a signal superimposing transmission line, and first ends of signal blocking lines are connected to outputs of the first and second transistors, respectively, and a bias supply line is connected between the second ends of the first and second signal blocking lines. The distributed high frequency circuit is, for example, an amplifier circuit or balanced mixer.

With this configuration, since a bias is provided to the outputs of the first and second transistors by externally supplying the bias to any point of the bias supply line, it is enough for the bias to be supplied only from a terminal of one side of the circuit; which makes external wiring for supplying the bias simplified even when a plurality of distributed high frequency circuits are cascaded.

Further, an amount short of current into the signal superimposing transmission line has only to be supplemented through the bias supply line, and the main portion of the bias supply line can be straight; therefore, it is enough for a chip area to be a little larger than a configuration in which biases are provided to the outputs of the first and second transistors from both sides of a distributed high frequency circuit. In other words, the widths of the signal superimposing transmission line and signal blocking lines can be narrower than those of the prior art configuration in which the bias is supplied to the outputs of transistors from one side of the distributed high frequency circuit; therefore a chip area can be smaller.

Besides, since the bias supply line is provided, it is not required that a desired bias current is supplied to the signal superimposing transmission line, and therefore the limitation thereof can be removed from the design of the signal superimposing transmission line, resulting in improving circuit characteristics.

Further, since a bias input terminal may be connected to any position of the bias supply line, degree of freedom to select the position increases.

In the above configuration, if the signal blocking line is folded in a first direction and the bias supply line mainly has a straight portion in a second direction perpendicular to the first direction, the bias supply line can be shorter.

In the above described configuration, if the signal superimposing transmission line is also folded in the first direction, the bias supply line can be further shorter, therefore the bias supply line can be further narrower, resulting in further reducing the chip area.

Other aspects, objects, and the advantages of the present invention will become apparent from the following detailed description taken in connection with the accompanying drawings.

DESCRIPTION OF THE PREFERRED EMBODIMENTS

Figure 1:
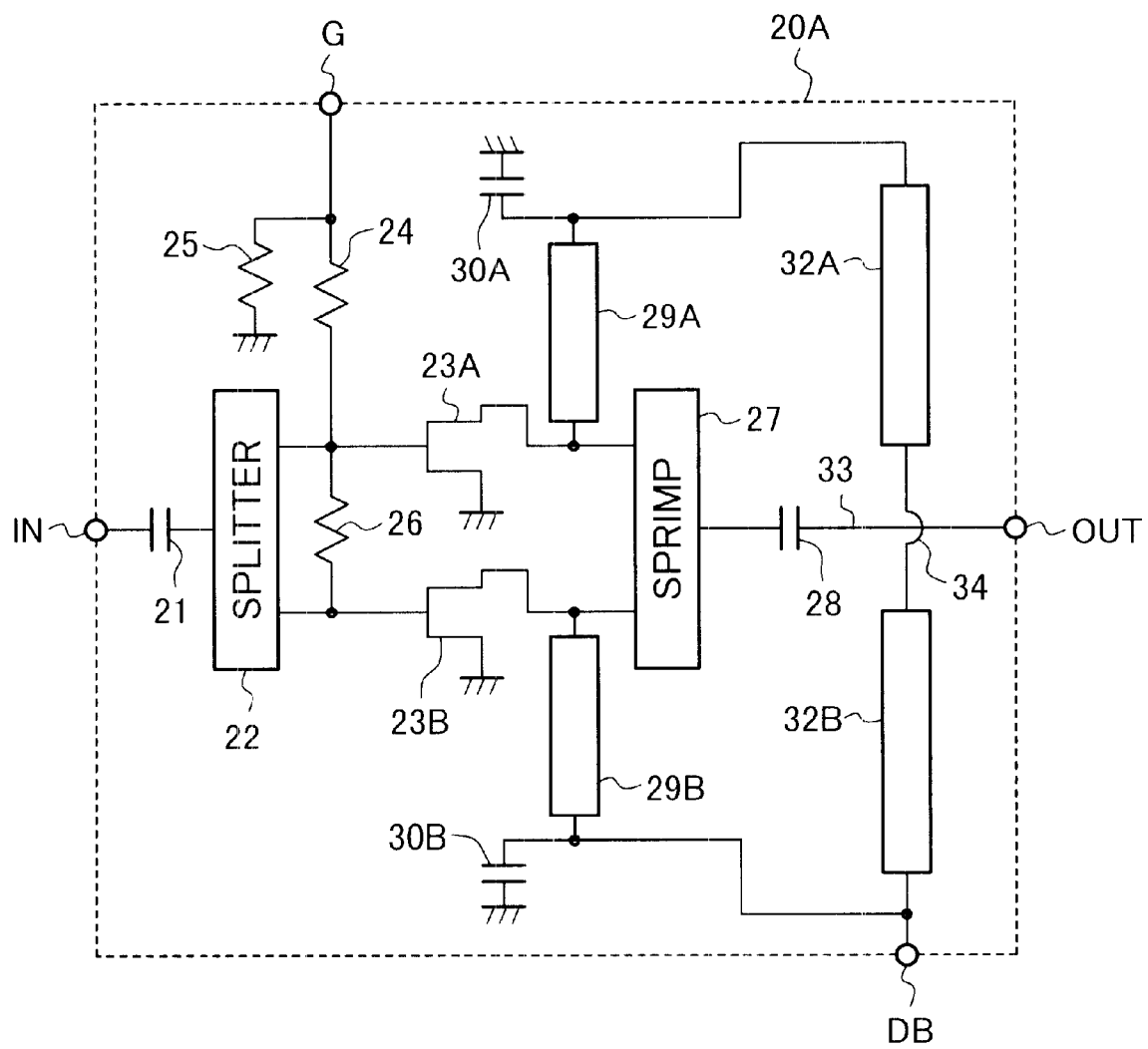
FIG. 1 is a circuit diagram showing a distributed high frequency amplifier of a first embodiment according to the present invention.

Referring now to the drawings, wherein like reference characters designate like or corresponding parts throughout several views, preferred embodiments of the present invention are described below.

First Embodiment

Transistors in the drawings are FETs with MES structure, however they have only to be ones suitable for high frequency applications and may be MOSFETs, HEMTs or HBTs of bipolar transistors.

FIG. 1 shows a distributed high frequency amplifier 20A of a first embodiment according to the present invention.

Figure 9:
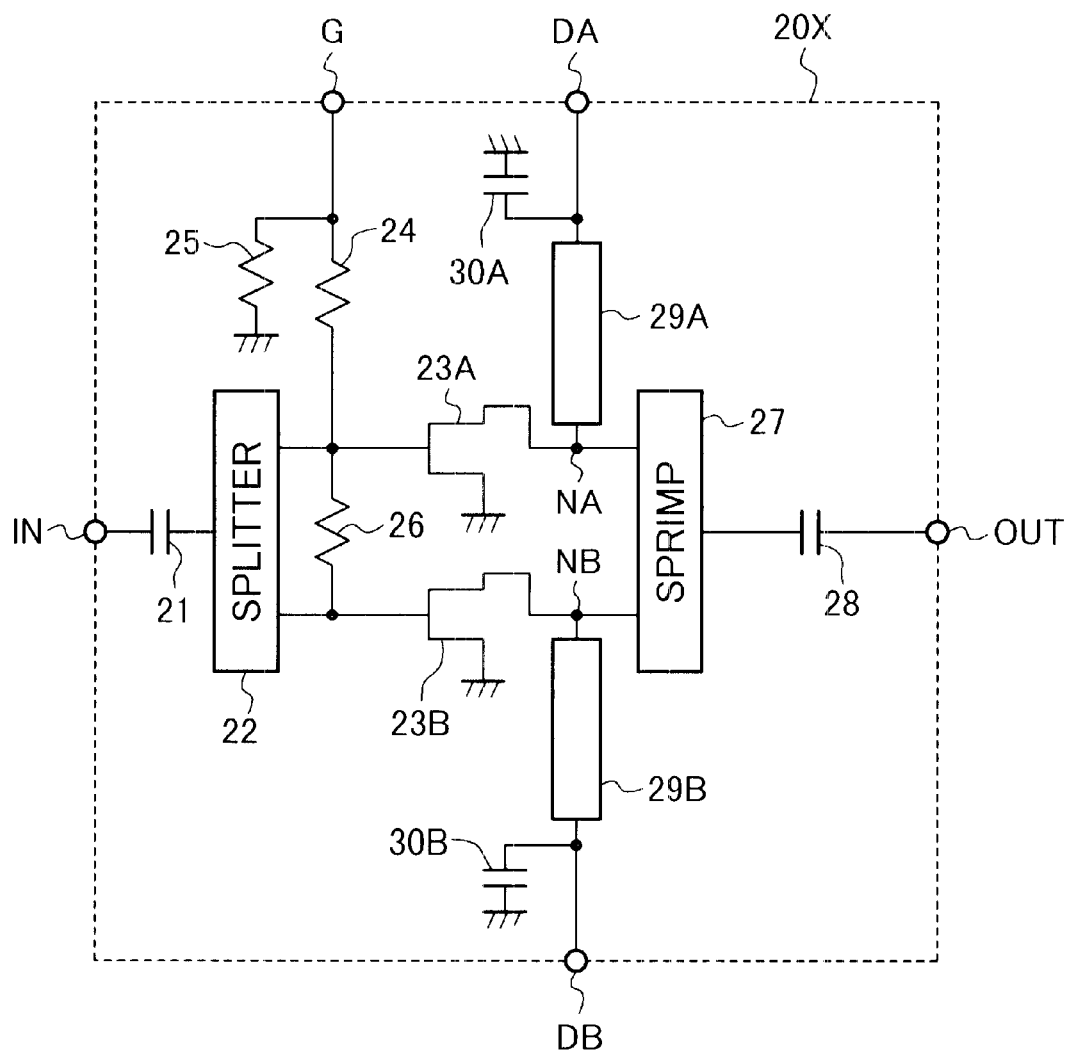
FIG. 9 is a circuit diagram showing another prior art distributed high frequency amplifier.

The distributed high frequency amplifier 20A consists of the distributed high frequency amplifier 20X of FIG. 9, bias supply lines 32A and 32 B, and a jumper 34, wherein one ends of bias supply lines 32A and 32B are connected to distal ends of the respective drain bias transmission lines 29A and 29B, and the jumper 34 is connected between the other ends of the bias supply line 32A and 32B. The jumper 34 crosses over a transmission line 33 between the capacitor 28 and the output OUT. The jumper 34 is formed of, for example, a bonding wire, an interconnection in multilayer wiring, or an air bridge. Since almost no signal flows through the bias supply lines 32A and 32B as described above, the width thereof can be determined according to a current value thereof.

According to this first embodiment, the drain bias input DA of FIG. 9 can be omitted by the configuration in which the bias supply lines 32A and 32B, and the jumper 34 are added to the circuit of FIG. 9 without altering shapes of the drain bias transmission lines 29A and 29B and the power superimposition circuit 27 of FIG. 9.

Figure 11:
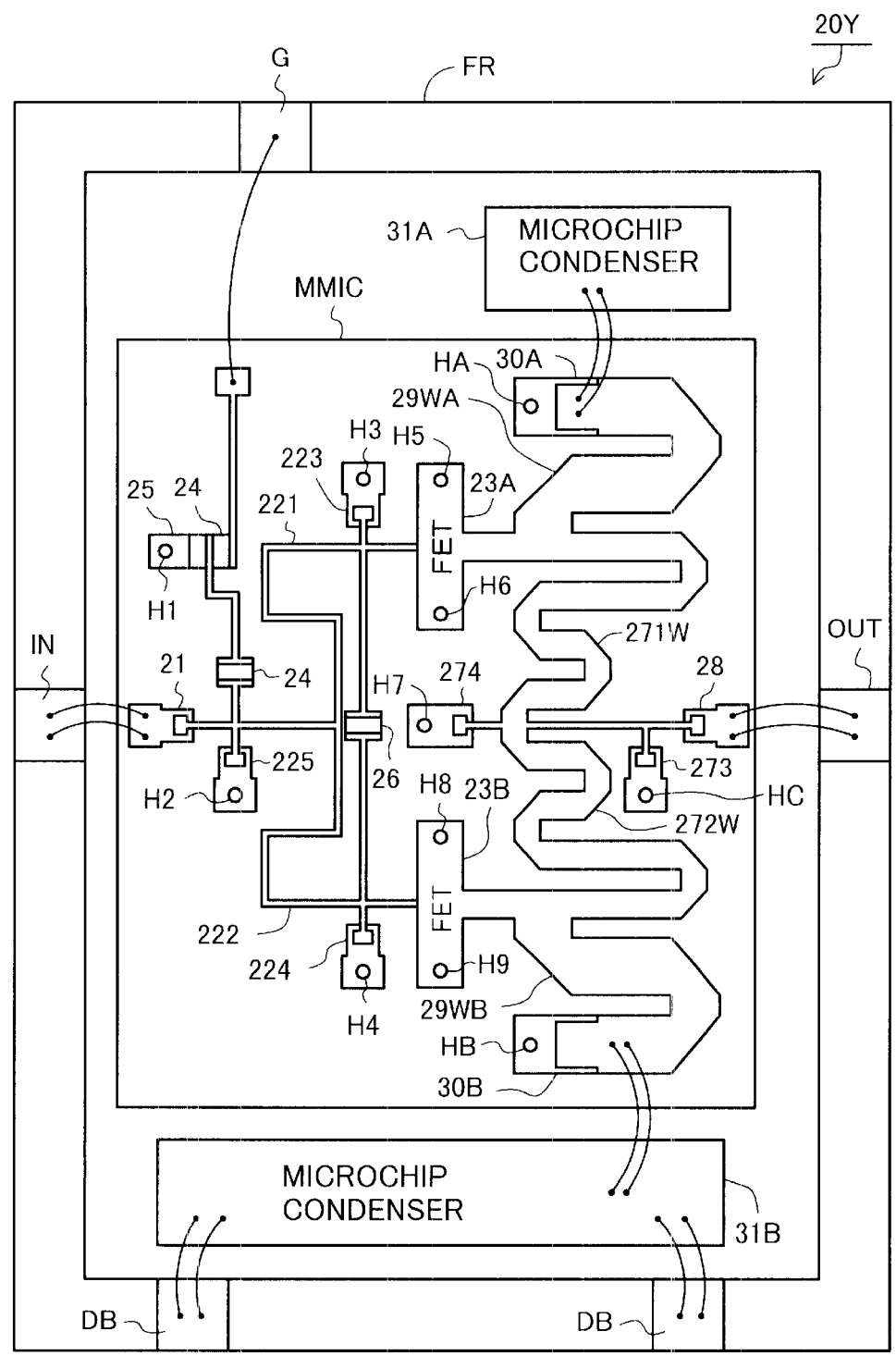
FIG. 11 is a layout in a case where the circuit of FIG. 10 is constituted of MMIC.

Further, the chip area of the distributed high frequency circuit 20A is larger only by a small area corresponding to addition of the bias supply lines 32A and 32B and the jumper 34 than the distributed high frequency amplifier 20X of FIG. 9. The reason why is as follows:

(1) each of the drain bias transmission lines 29A and 29B as signal blocking lines and the power superimposition circuit 27 as a signal superimposition line has a shape folded in one direction in order to reduce an occupied area as shown in FIG. 11 for example; therefore a length in a direction perpendicular to the one direction is relatively short;

(2) the bias supply lines 32A and 32B are preferably as short as possible; therefore these lines are straight lines in a direction perpendicular to the one direction; and (3) Although there is no necessity for supplying a drain bias through the power superimposition circuit 27, no problem arises even if part of the drain bias flows through the power superimposition circuit 27, and part of the drain bias actually flows therethrough; therefore an amount short of current into the power superimposition circuit 27 has only to be supplemented through the bias supply lines 32A and 32B and the jumper 34.

From the above (1) and (2), the total length of the bias supply lines 32A and 32B is approximately equal to or a little longer than the length of the drain bias transmission line 29A. From the combination of this and the above (3), it is enough for the line width of each of the bias supply lines 32A and 32B to be approximately equal to or a little wider than that of the drain bias transmission line 29A.

Figure 8:
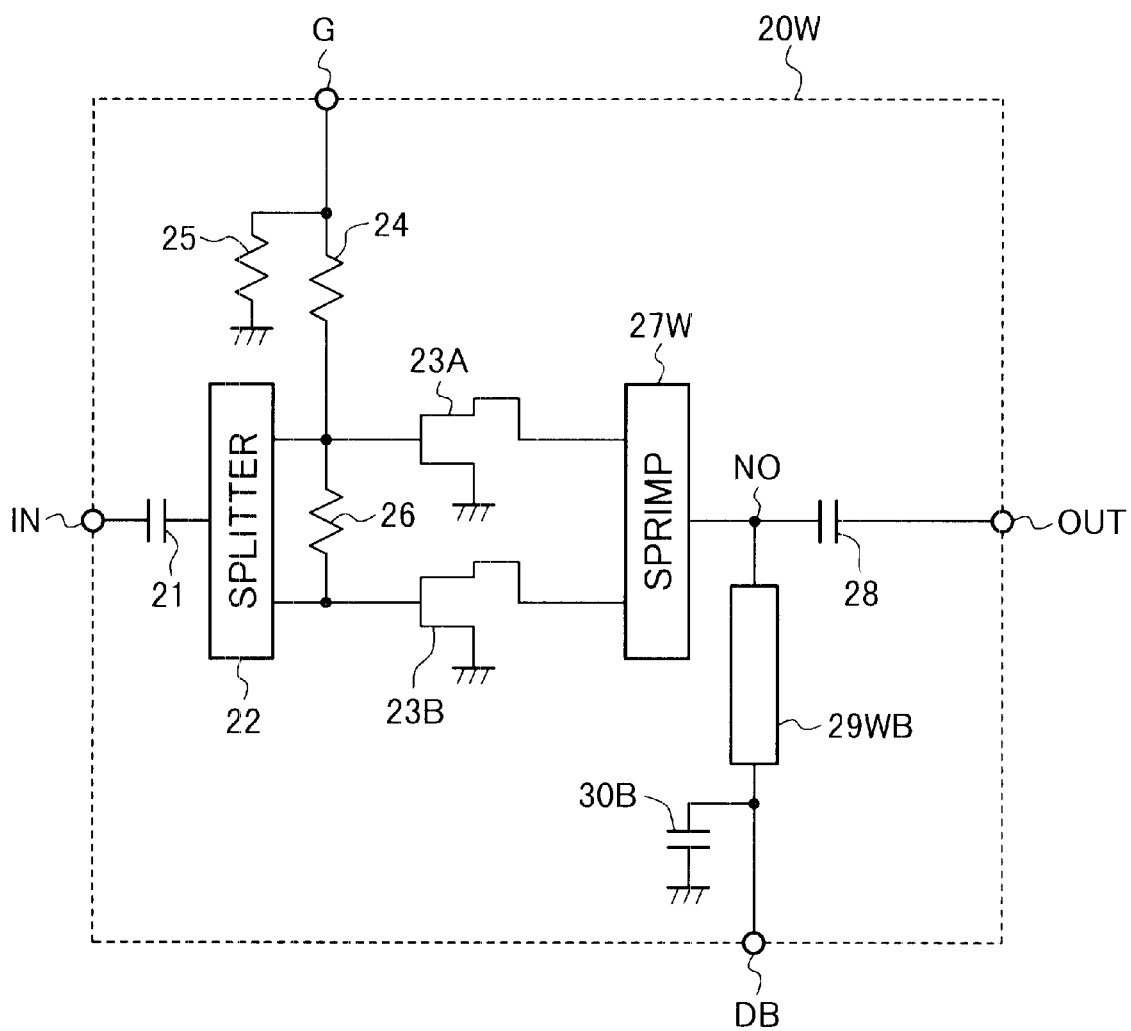
FIG. 8 is a circuit diagram showing a prior art distributed high frequency amplifier.
Figure 10:
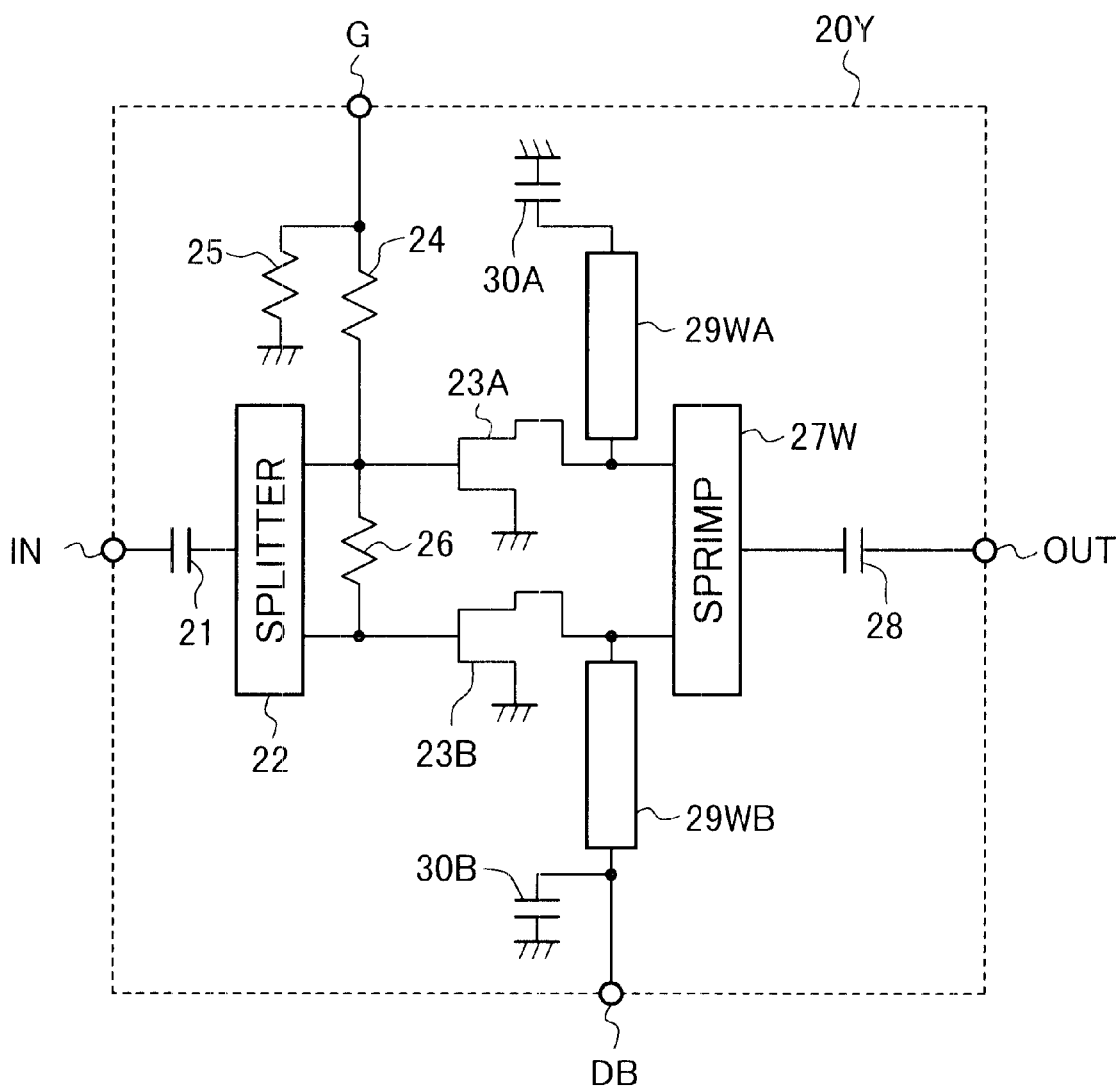
FIG. 10 is a circuit diagram showing another prior art distributed high frequency amplifier.
Figure 12:
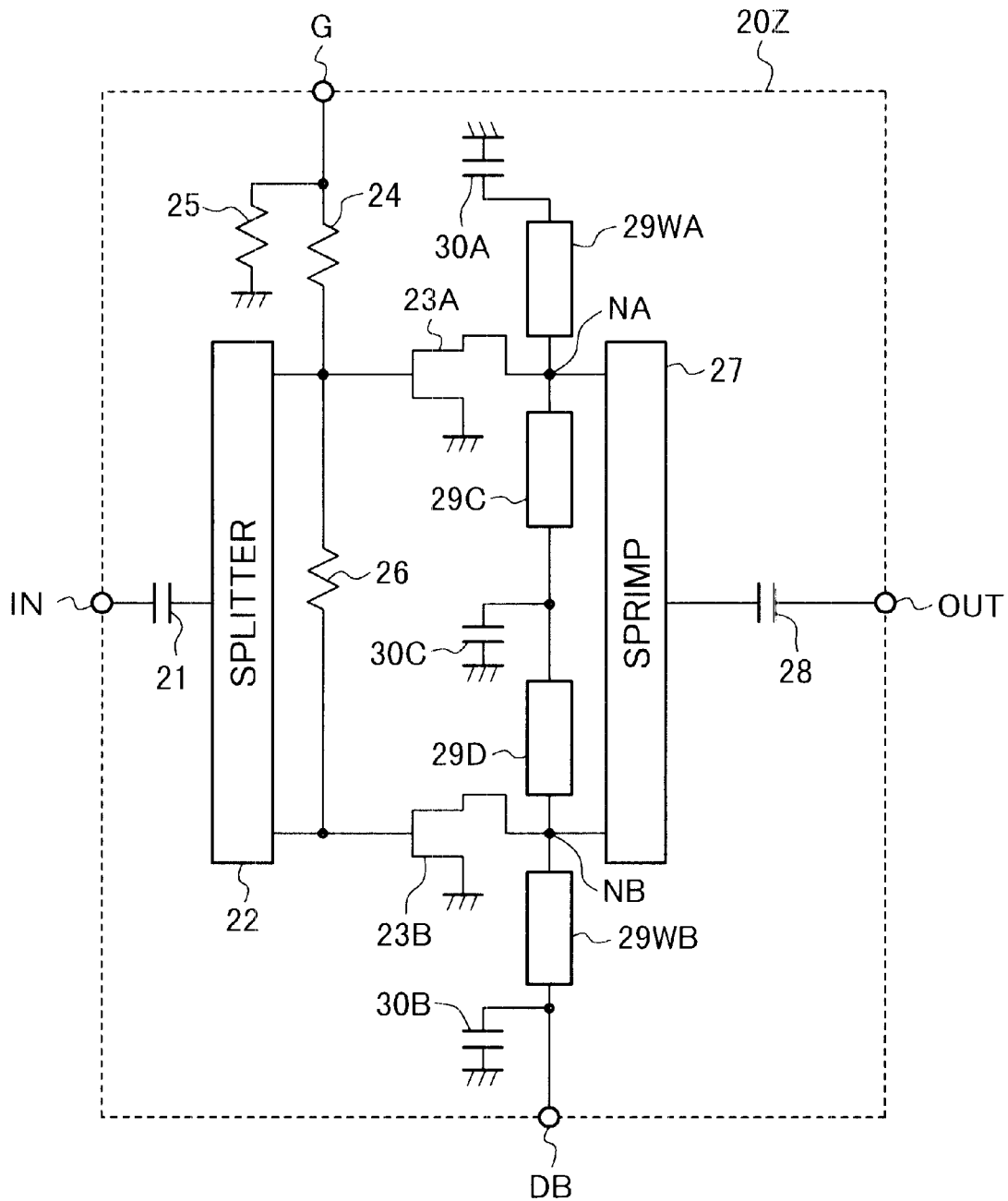
FIG. 12 is a circuit diagram showing still another prior art distributed high frequency amplifier.

The chip area of the distributed high frequency amplifier 20A can be smaller than each of those of the distributed high frequency amplifiers 20W of FIG. 8, 20Y of FIG. 10 and 20Z of FIG. 12. This can be understood with ease from FIG. 11. That is, as shown in FIG. 11, the line widths of the drain bias transmission lines 29WA and 29WB and the transmission lines 271W and 272W largely influence on the chip area, however in the case of FIG. 1, the corresponding line widths can be approximately halves of the respective those of FIG. 11, and further as described above, each of the bias supply lines 32A and 32B can be a straight line and the width thereof can be approximately equal to or a little wider than the line width of the drain bias transmission line 29A.

Furthermore, since no necessity arises for supplying a drain bias current through the power superimposition circuit 27, design of the power superimposition circuit 27 working as a matching circuit is not limited, and thereby the power superimposition circuit 27 is superior in high frequency characteristics to the circuits of FIGS. 8 and 10 designed under the limitation.

Further, since no necessity arises for supplying the drain bias current to the power superimposition circuit 27, a capacitor as a matching circuit element can also be interposed in series with the line of the power superimposition circuit 27, thereby increasing degrees of freedom in design of the power superimposition circuit 27.

Still further, since the drain bias input terminal DB may be connected to any position on the bias supply lines 32A and 32B, degrees of freedom in the connection increase.

Second Embodiment

Figure 2:
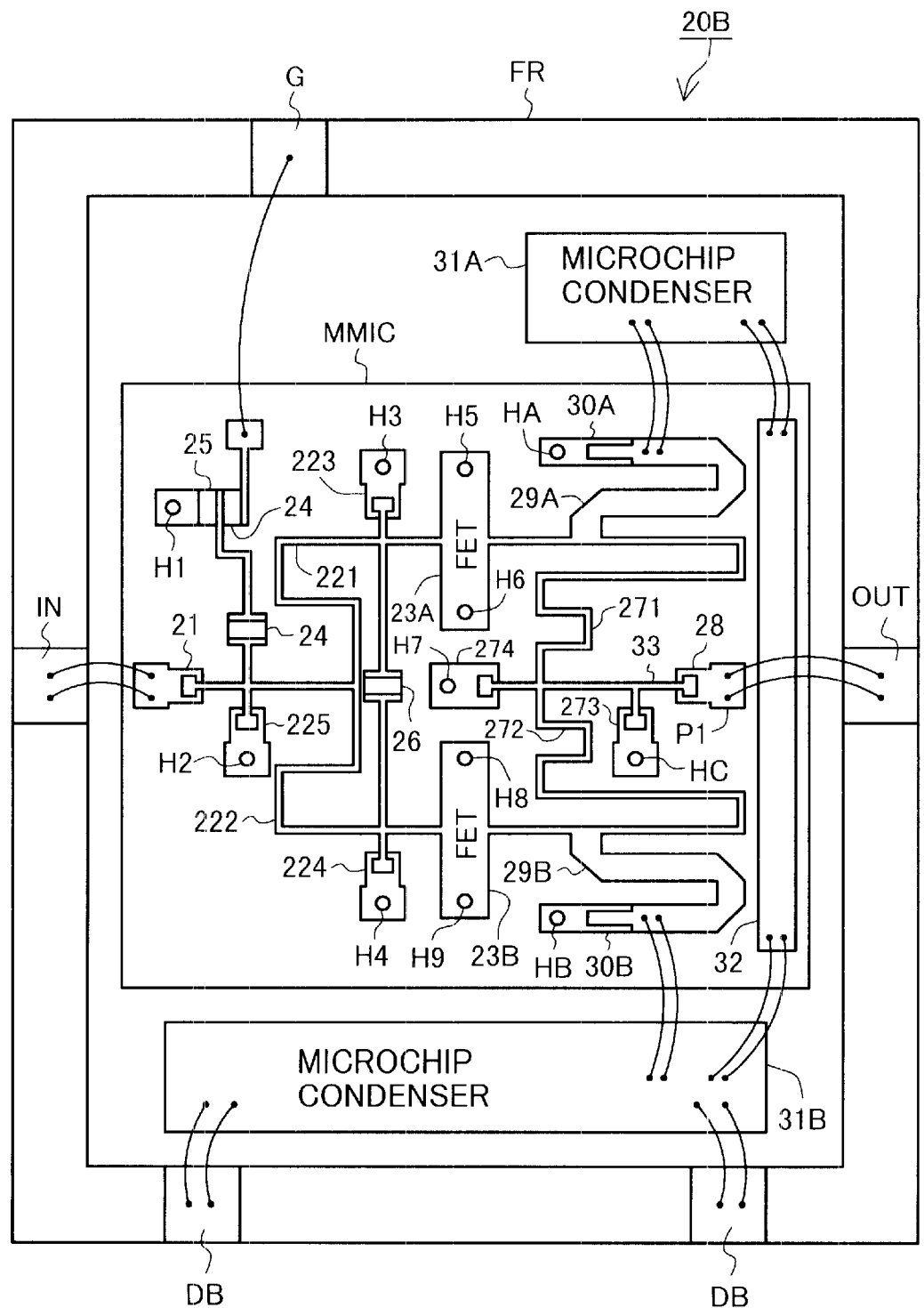
FIG. 2 is a layout of a distributed high frequency amplifier of a second embodiment according to the present invention.

FIG. 2 shows a layout of a distributed high frequency amplifier 20B of a second embodiment according to the present invention.

In the distributed high frequency amplifier 20B, the bias supply lines 32A and 32B in FIG. 1 are replaced with one bias supply line 32, and a pad P1 connected to one electrode of the capacitor 28, and the output OUT which is an inner lead outside the MMIC chip are connected with each other by bonding wires.

Although in order to reduce line resistance, two drain bias input terminals DB are provided, the two drain bias input terminals DB are disposed on one side of the MMIC chip; therefore no necessity arises for wiring external interconnections in a complex way as in the case of FIG. 9.

Further, the gate bias resistor 24 is connected to the input side line with respect to the power splitter circuit 22. The microchip condensers 31A and 31B are the same as those in FIG. 11, with a different point from FIG. 11 that the bias supply line 32 is connected to the drain bias transmission line 29A through one electrode of the microchip condenser 31A for drain bias stabilization and bonding wires. That is, to the one electrode of the microchip condenser 31A, ends of the bias supply line 32 and the drain bias transmission line 29A are connected through bonding wires.

The other points are the same as those of FIG. 1.

As described above, the widths of the transmission lines 271 and 272 of the power superimposition circuit 27 and the drain bias transmission lines 29A and 29B are approximately halves of respective those of FIG. 11, and the bias supply line 32 is a straight line in shape and it is enough for the width thereof to be approximately a little wider than that of the drain bias transmission line 29A; therefore the chip area of MMIC can be smaller than that in the case of FIG. 11.

Third Embodiment

Although in the above embodiments, description is given of the case where two transistors are connected in parallel to each other, the present invention can be further applied to a case where multiple transistors more than two are connected in parallel to each other.

Figure 3:
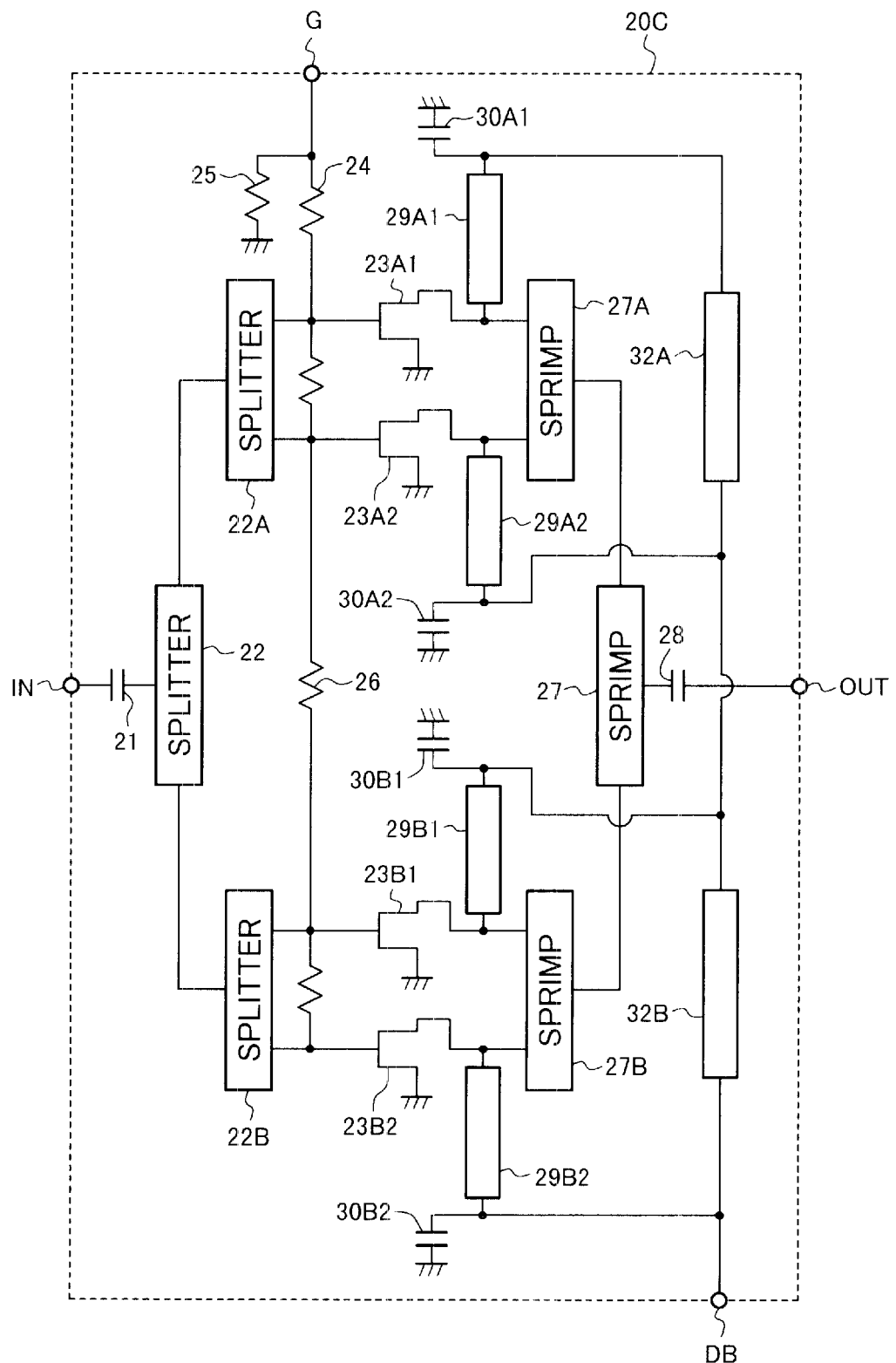
FIG. 3 is circuit diagram showing a distributed high frequency amplifier of a third embodiment according to the present invention.

FIG. 3 shows a distributed high frequency amplifier 20C of a third embodiment according to the present invention.

In the distributed high frequency amplifier 20C, 4 transistors 23A1, 23A2, 23B1 and 23B2 are connected in parallel to each other, and a signal current flowing to the output OUT amounts double that of FIG. 1. The power splitter circuit 22 equally distributes an incoming signal power to power splitter circuits 22A and 22B, the power splitter circuit 22A equally distributes the signal power to the gates of transistors 23A1 and 23A2, and the power slitter circuit 22B equally distributes the signal power to the gates of the transistors 23B1 and 23B2.

Signals flowing from the drains of the transistors 23A1 and 23A2 are combined into the power superimposition circuit 27A, signals flowing from the drains of the transistors 23B1 and 23B2 are combined into the power superimposition circuit 27B, and the outputs of the power superimposition circuits 27A and 27B are combined into the power superimposition circuit 27. One ends of drain bias transmission lines 29A1, 29A2, 29B1 and 29B2 each having a length of $\lambda/4$, where $\lambda$ denotes a signal wavelength, are connected to the respective drains of the transistors 23A1, 23A2, 23B1 and 23B2, and to the other ends thereof, capacitors 30A1, 30A2, 30B1 and 30B2 for signal grounding are respectively connected. The other ends of the drain bias transmission lines 29A1 and 29A2 are connected to each other through the bias supply line 32A, and the other ends of the drain bias transmission lines 29B1 and 29B2 are connected to each other through the bias supply line 32B. The bias supply lines 32A and 32B are connected to each other through the jumper 34. One end of the bias supply line 32B is connected to the drain bias input terminal DB.

No necessity arises for supplying drain bias currents to the power superimposition circuits 27A, 27B and 27. Hence, it is enough for each of the widths of the drain bias transmission lines 29A1, 29A2, 29B1 and 29B2 to have a size necessary to supply a drain bias current of one transistor. Further, each of the bias supply lines 32A and 32B may be of a straight line in shape. Accordingly, an effect similar to that of the first embodiment can be achieved in the third embodiment as well.

Fourth Embodiment

Although in the above embodiments, description is given of the case where the transistors are connected in parallel to each other, the present invention is only required to include transistors connected in parallel and can be further applied to a case where transistors connected in series are also included.

Figure 4:
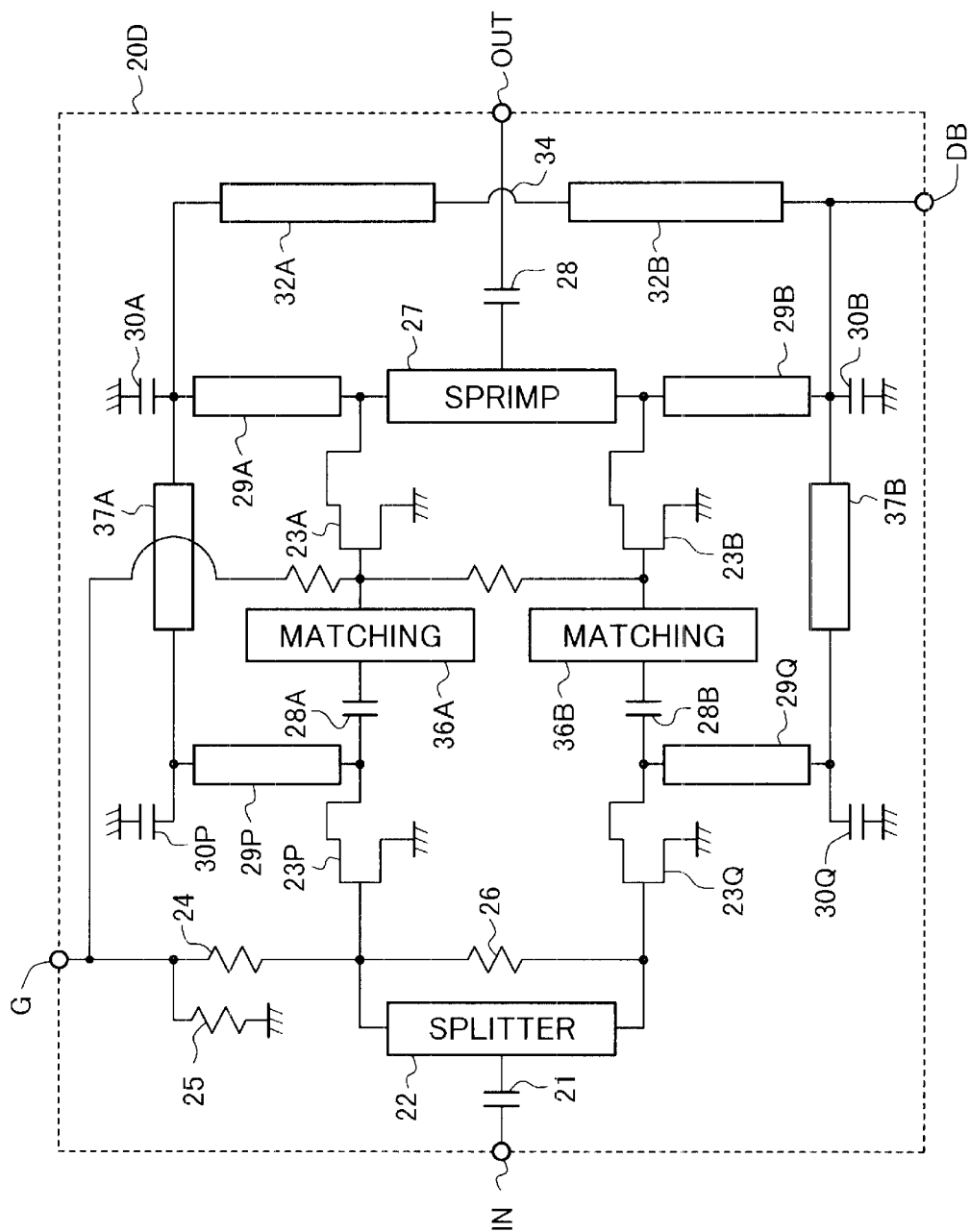
FIG. 4 is circuit diagram showing a distributed high frequency amplifier of a fourth embodiment according to the present invention.

FIG. 4 shows a distributed high frequency amplifier 20D of a fourth embodiment according to the present invention.

In the distributed high frequency amplifier 20D, a transistor 23P is cascaded to the transistor 23A through a capacitor 28A and an interstage matching circuit 36A, a transistor 23Q is cascaded to a transistor 23B through a capacitor 28B and an interstage matching circuit 36B, and these cascaded circuits are connected in parallel between the power splitter circuit 22 on the input side and the power superimposition circuit 27 on the output side. A drain bias transmission line 29P and a capacitor 30P are connected in series between the drain of the transistor 23P and ground in a way similar to the case of the transistor 23A. Likewise, a drain bias transmission line 29Q and a capacitor 30Q are connected in series between the drain of the transistor 23Q and ground in a way similar to the case of the transistor 23B.

The distal ends of the drain bias transmission lines 29P and 29A are connected to each other through a bias supply line 37A, and the distal ends of the drain bias transmission lines 29Q and 29B are connected to each other through a bias supply line 37B, which is the same configuration disclosed in JP 11-112250. The feature of the fourth embodiment is that the distal ends of the drain bias transmission lines 29A and 29B are further connected to each other through the bias supply lines 32A and 32B and the jumper 34 as same as in FIG. 1.

In a case where the bias supply lines 32A and 32B and the jumper 34 are not connected as the prior art, necessities arise for supplying a drain current for three transistors 23B, 23A and 23P to the drain bias transmission line 29B, and for supplying a drain current for two transistors 23A and 23P to the power superimposition circuit 27, and besides for the drain loads of the transistors 23A and 23B being equal to each other; therefore the line widths thereof have to be wider.

In contrast to this, in the fourth embodiment, by providing the bias supply lines 32A and 32B and the jumper 34 straight in shape, no necessity arises for supplying a drain bias current to the power superimposition circuit 27, thereby it is enough for each of the drain bias transmission lines 29A and 29B to have a width necessary to supply a drain bias current for one transistor; therefore the same effects as those described in the first embodiment can be obtained.

Fifth Embodiment

Figure 5:
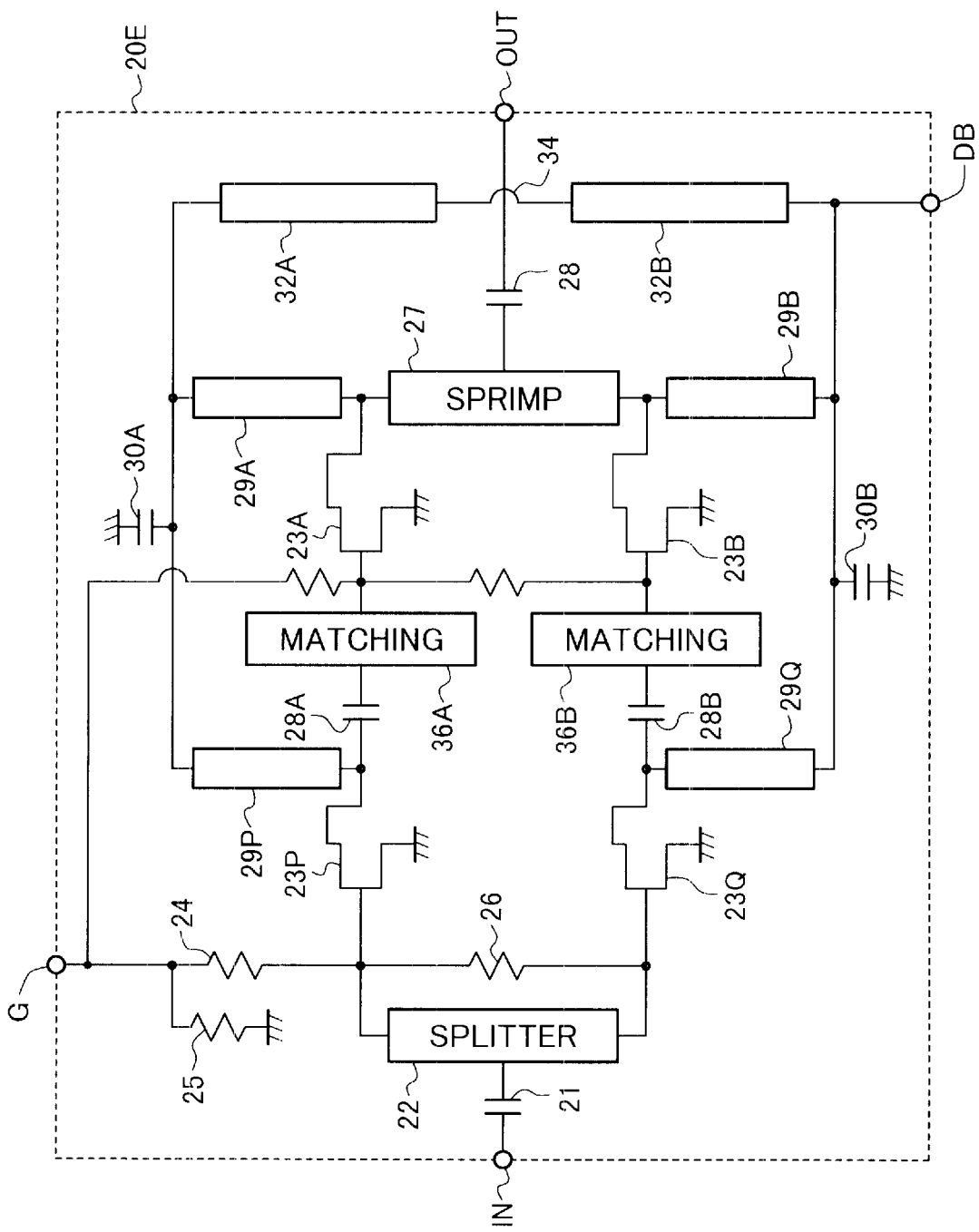
FIG. 5 is circuit diagram showing a distributed high frequency amplifier of a fifth embodiment according to the present invention.

FIG. 5 shows a distributed high frequency amplifier 20E of a fifth embodiment according to the present invention.

In the distributed high frequency amplifier 20E, the bias supply lines 37A, and 37B, and the capacitors 30P and 30Q are omitted in FIG. 4, the distal ends of the drain bias transmission lines 29P and 29A are disposed close to each other and connected to the common capacitor 30A, and the distal ends of the drain bias transmission lines 29Q and 29B are disposed close to each other and connected to the common capacitor 30B.

The other points are the same as those of FIG. 4.

Sixth Embodiment

Although in the above described embodiment, description is given of the case where the present invention is applied to the distributed high frequency amplifier circuit, the present invention can be applied to various kinds of distributed high frequency circuits having transistors connected in parallel.

Figure 6:
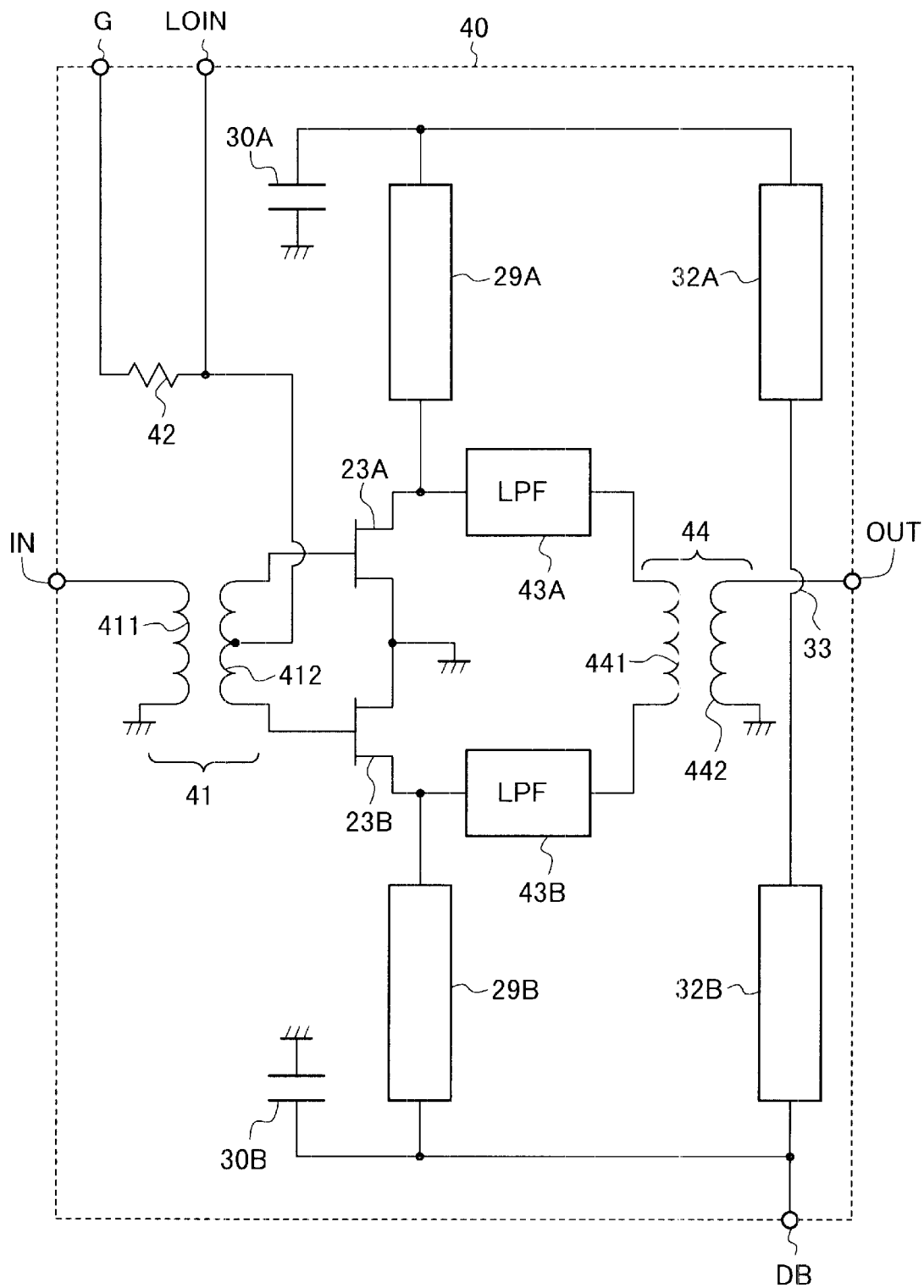
FIG. 6 is a circuit diagram showing a balanced mixer of a sixth embodiment according to the present invention.
Figure 7:
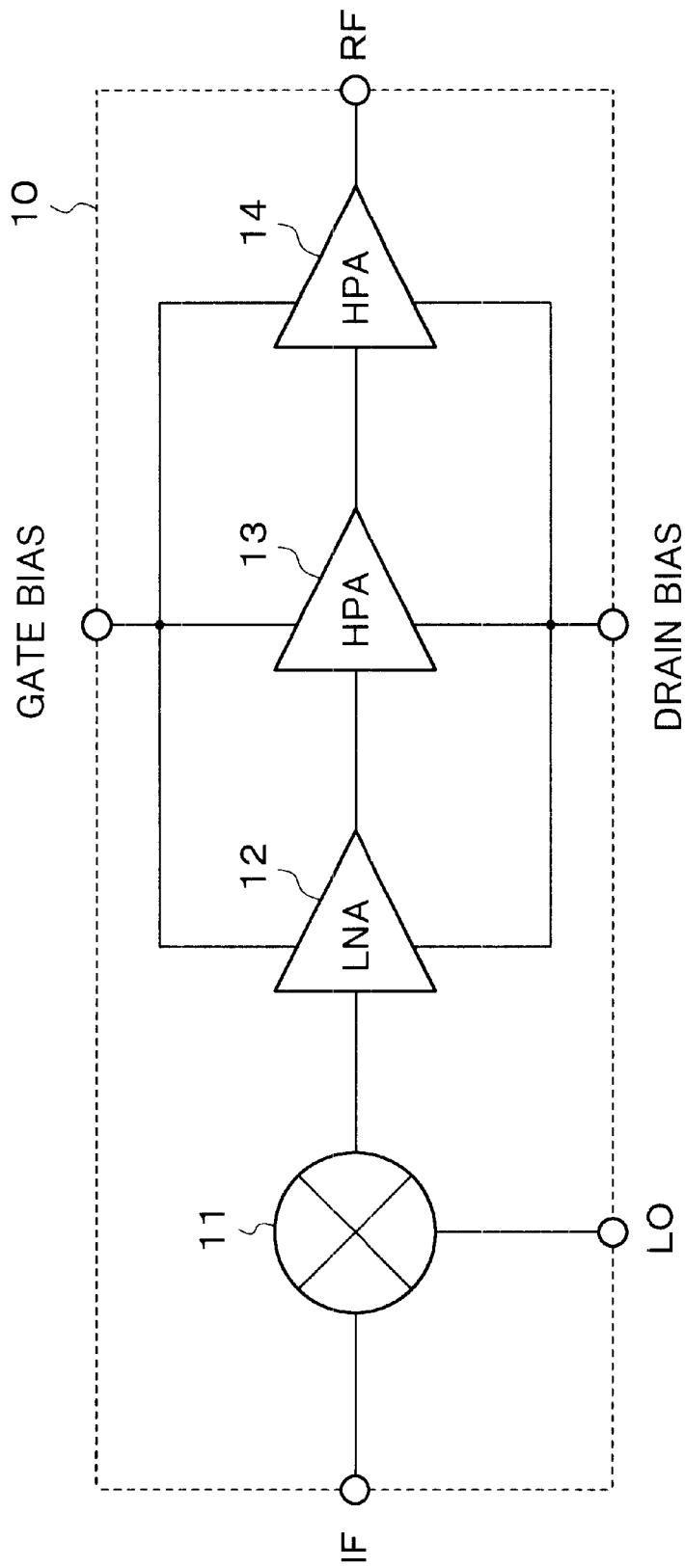
FIG. 7 is a block diagram showing a transmitter of a base station for a portable telephone.

FIG. 6 shows a balanced mixer 40 of a sixth embodiment according to the present invention.

In the balanced mixer 40, one and the other ends of the primary coil 411 of a mixing transformer 41 are connected to an input IN and ground, respectively, and one and the other ends of the secondary coil 412 of the mixing transformer 41 are connected to gates of the transistors 23A and 23B, respectively. An intermediate tap of the secondary coil 412 is connected not only directly to a local oscillation input LOIN but also to a gate bias input G through a resistor 42. A bias voltage is applied to the gate bias input G such that the transistors 23A and 23B each perform half-wave rectification. The sources of the transistors 23A and 23B are both connected to ground. Thereby, a signal from the input IN becomes ones in reverse phase with each other at the gates of the transistors 23A and 23B. The drains of the transistors 23A and 23B are connected to one and the other ends, respectively, of the primary coil 441 of a power superimposing transformer 44, as a signal superimposing transmission line, through low pass filters 43A and 43B. A local oscillation signal from the local oscillation input becomes ones in phase with each other at the gates of the transistors 23A and 23B. The low pass filters 43A and 43B transmits an intermediate frequency (IF) signal whose frequency is a difference between the frequency of an RF (Radio Frequency) signal provided to the input IN and the frequency of the local oscillation signal provided to the input LOIN. Hence, the IF signal is outputted from the output OUT connected to one end of the secondary coil 442 of the power superimposing transformer 44.

A circuit supplying a bias to the drains of the transistors 23A and 23B connected in parallel to each other is the same as that of FIG. 1, and the same effects as those described in the first embodiment can be obtained in the sixth embodiment as well.

Although preferred embodiments of the present invention has been described, it is to be understood that the invention is not limited thereto and that various changes and modifications may be made without departing from the spirit and scope of the invention.

For example, the present invention can be applied to various kinds of circuits in which outputs of a plurality of transistors are connected in parallel to each other, including a mixer configured such that in FIG. 6, high pass filters are used instead of the low pass filters 43A and 43B and an IF signal is provided to the input IN to obtain an RF signal from the output OUT.

Further, such a configuration is included in the present invention that in FIG. 2, the microchip condenser 31A is omitted, and one end of the bias supply line 32 and the distal end of the drain bias transmission line 29A are connected with each other through a bonding wire or a line.

Furthermore, a signal blocking line may be an inductor.

What is claimed is:

1. A distributed high frequency circuit comprising:
   first and second transistors;
   a signal superimposing transmission line through which outputs of said first and second transistors are connected in parallel to each other;
   first and second signal blocking transmission lines, each having first and second ends, first ends of said first and second signal blocking transmission lines being connected to said outputs of said first and second transistors, respectively, to supply a DC bias; and
   a bias supply line connected between said second ends of said first and second signal blocking transmission lines.

2. The distributed high frequency circuit of claim 1, wherein each of said first and second signal blocking transmission lines are folded in a first direction,
   wherein said bias supply line mainly have a straight portion in a second direction perpendicular to said first direction.

3. The distributed high frequency circuit of claim 2, wherein said signal superimposing transmission line is folded in said first direction.

4. The distributed high frequency circuit of claim 3, further comprising: an output transmission line extending in said first direction from an intermediate portion of said signal superimposing transmission line;
   wherein said bias supply line comprising:
      first and second lines formed on one side and the other side of said output transmission line; and
      a jumper, connected between said first and second lines, crossing over said output transmission line apart from said output transmission line.

5. The distributed high frequency circuit of claim 3, further comprising:
   an output transmission line extending in said first direction from an intermediate portion of said signal superimposing transmission line;
   a signal output terminal; and
   a jumper, connected between said output transmission line and said signal output terminal, crossing over said bias supply line apart from said bias supply line.

6. The distributed high frequency circuit of claim 3, further comprising: a bias input terminal connected to said bias supply line.

7. The distributed high frequency circuit of claim 3, wherein each of said first and second signal blocking transmission lines comprises:
   a transmission line, having a length of approximately λ/4, where λ denotes a signal wavelength, having first and second ends as said first and second ends of said signal blocking transmission line; and
   a capacitor, connected to said second ends of corresponding said transmission line, for signal grounding.

8. The distributed high frequency circuit of claim 3, wherein said distributed high frequency circuit is an amplifier circuit further comprising:
   a power splitter circuit distributing an incoming signal to control inputs of said first and second transistors.

9. The distributed high frequency circuit of claim 3, wherein said distributed high frequency circuit is a balanced mixer circuit further comprising:
   a mixing transformer having primary and secondary coils, said primary coil receiving an incoming signal, said secondary coil having first and second ends connected to control inputs of said first and second transistors, respectively;

a first filter connected between said output of said first transistor and a first end of said signal superimposing transmission line to transmit a signal of desired frequencies; and a second filter connected between said output of said second transistor and a second end of said signal superimposing transmission line to transmit a signal of said desired frequencies.

10. A semiconductor device having a semiconductor substrate on which a distributed high frequency circuit is formed, said distributed high frequency circuit comprising:

first and second transistors;

a signal superimposing transmission line through which outputs of said first and second transistors are connected in parallel to each other;

first and second signal blocking transmission lines, each having first and second ends, first ends of said first and second signal blocking transmission lines being connected to said outputs of said first and second transistors, respectively, to supply a DC bias; and a bias supply line connected between said second ends of said first and second signal blocking transmission lines.

11. The semiconductor device of claim 10, further comprising:

a stabilizing capacitor connected to said bias supply line to stabilize a supplied drain bias voltage; and a drain bias input terminal connected to said stabilizing capacitor.

* * * * *